United States Patent [19]

Bartlett

[11] 4,360,784

[45] Nov. 23, 1982

[54] TRANSFORMER COUPLED ISOLATION AMPLIFIER

[75] Inventor: Peter G. Bartlett, Davenport, Iowa

[73] Assignee: Automation Systems, Inc., Eldridge, Iowa

[21] Appl. No.: 177,588

[22] Filed: Aug. 13, 1980

[51] Int. Cl.³ .......................... H03F 1/34; H03F 3/38
[52] U.S. Cl. ......................................... 330/9; 330/10; 330/75; 330/189
[58] Field of Search .................. 330/9, 10, 75, 165, 330/167, 188, 189, 195, 196

[56] References Cited

U.S. PATENT DOCUMENTS

| | | | |
|---|---|---|---|
| 3,089,097 | 5/1963 | Bell | 330/10 X |
| 3,828,269 | 8/1974 | Norton | 330/165 X |
| 3,947,779 | 3/1976 | Reinhard | 330/10 |
| 4,191,929 | 3/1980 | Max et al. | 330/10 |
| 4,270,061 | 5/1981 | Gronner et al. | 330/165 X |

OTHER PUBLICATIONS

Gol'dshtein et al, "An Amplifier for a Potentiostat," *Instruments and Experimental Techniques*, vol. 18, No. 6, Pt. 2, pp. 1849-1850 Nov.-Dec. 1975.

*Primary Examiner*—James B. Mullins
*Attorney, Agent, or Firm*—Woodard, Weikart, Emhardt & Naughton

[57] ABSTRACT

A transformer-coupled isolation amplifier which has a minimally sized transformer, high common mode rejection, and a highly linear response over a wide dynamic range. A first chopper periodically alternates by 180° the connection of the input through a high resistance to the primary of a small square loop pulse transformer. The secondary, with the end of the winding closest to the primary grounded, has the inputs of an operational amplifier placed across it. Negative feedback is provided around the amplifier to provide an apparent very low impedance across the secondary of the transformer. The negative feedback induces a current in the transformer secondary which cancels the flux produced by current flowing in the primary, thereby allowing usage of the transformer normally suitable only for high speed pulses. The output of the amplifier connects to a second chopper synchronous with the first to generate the amplified analog signal. A unique isolated power supply supplies power and switching signals for the first chopper.

12 Claims, 3 Drawing Figures

TRANSFORMER COUPLED ISOLATION AMPLIFIER

FIELD OF THE INVENTION

This invention is related to isolation amplifiers and more particularly to transformer coupled isolation amplifiers having an effectively low impedance load on the secondary of the transformer.

BACKGROUND OF THE INVENTION

In providing for electronic instrumentation or industrial control, it is frequently necessary to apply a signal from a signal source, such as a sensor, thermocouple, or transducer, to electronic signal processing circuitry while maintaining complete electrical isolation between the signal source and the signal processing electronics. Various methods are presently used in constructing such isolation amplifiers, including transformer coupling. However, transformer coupling has required rather large and expensive transformers. Means for miniaturizing the transformer below certain limits have not been known.

A circuit in U.S. Pat. No. 4,191,929 to Max and Weedon illustrates the use of a transformer having center tapped windings in an isolation amplifier. A chopper is used to convert the analog input signal into an AC signal suitable for the primary of the isolation transformer. A synchronous chopper is connected to the secondary of the isolation transformer to restore the analog signal. The secondary winding of the isolation transformer is connected across the differential inputs of a high-gain amplifier. Negative feedback is provided around the amplifier so that the transformer secondary winding is connected across a virtual short; and the negative feedback tends to drive the voltage applied to the inputs of the amplifier to a very small value. The negative feedback from the amplifier induces a current in the transformer secondary which cancels the flux produced by current flowing in the primary. While this circuit does result in improved linearity, it does not fully solve the problems of transformer size and full isolation. The inability to permanently ground the transformer windings at a point which will minimize capacitive coupling between the windings prevents optimum operation of the circuitry. An additional difficulty with this circuit is that it places the demodulator between the secondary and the operational amplifier. This degrades the performance of the circuit by adding resistance and switching noise in the loop with the transformer secondary and the amplifier input impedance, thereby departing from the ideal situation of zero impedance, zero noise loading of the secondary.

SUMMARY OF THE INVENTION

The invention is particularly defined in the claims and reference thereto should be made to determine the precise nature and scope of the invention. One embodiment of the invention is an isolation amplifier which includes two input terminals, a transformer having a primary and a secondary winding, a resistive coupling between said two input terminals and the primary of said transformer, an operational amplifier having its input coupled directly across the secondary winding of said transformer with a minimum of series resistance, and a resistor connecting from the output of said operational amplifier to its negative input to provide an extremely low effective input impedance. Other embodiments may have one end of the primary winding adjacent a grounded end of the secondary winding. Still other embodiments may incorporate very small high permeability transformer cores which will saturate within 10 microseconds if a voltage of 10 volts were to be applied to the primary winding. However, since there is a resistor in series with the primary (preferably of a value of at least 10,000 ohms) and since the secondary has a very low impedance load, the actual time for saturation tends to be better than 10 milliseconds for preferred circuits.

Circuits designed according to some of the claims may result in the use of significantly smaller transformers with significantly greater bandwidth than has been previously accomplished with similar circuits. Circuits designed according to some of the claims may use non-center-tapped transformers of very small size to provide a very high level of isolation and extremely high linearity. Circuits designed according to some of the claims may result in a lower noise level than has been achieved with similar circuits.

DESCRIPTION OF THE PREFERRED EMBODIMENT

Figure 1:
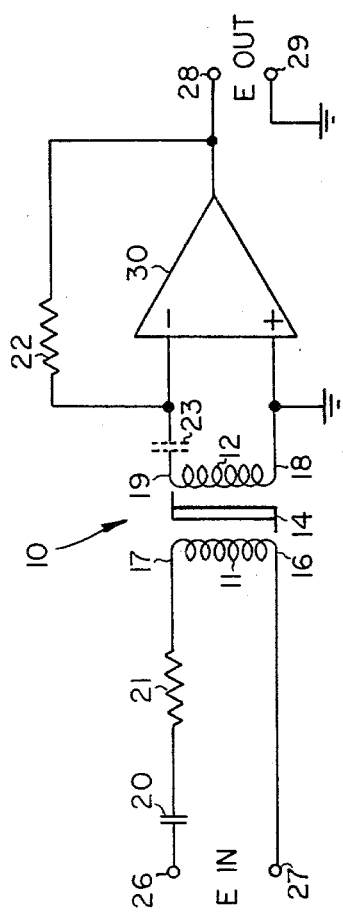
FIG. 1 discloses a circuit of the isolation amplifier in a simple form.

Referring more particularly to FIG. 1, there is illustrated one form of an isolation amplifier incorporating certain aspects of the invention. A transformer 10 has a 100 turn primary winding 11 having a first end 16 and a second end 17. Transformer 10 has a 100 turn secondary winding 12 having a first end 18 and a second end 19. The transformer is wound on a toroidal core 14 with a 3 mm. outside diameter and a 1.4 mm. inside diameter.

The core material is a high permeability, grain oriented alloy of 80% nickel and 20% iron, sometimes known as Supermalloy. The relative permeability of the core is about 100,000. To achieve the preferred small size, a relative permeability of at least about 30,000 is needed. The small size of the transformer is an advantage in physical placement in miniature circuits. More importantly, however, the small size of the core minimizes capacitive coupling between the primary and the secondary, minimizes leakage inductance, and minimizes eddy current losses. Transformer 10 will saturate in 2 microseconds with a 10 volt signal applied to the primary.

An input signal $E_{IN}$ is applied across input terminals 26 and 27. Terminal 27 connects to the first end 16 of primary winding 11. Terminal 26 connects through a series arrangement of capacitor 20 and resistor 21 to the second end 17 of primary winding 11. Capacitor 20 is a large value, chosen to prevent damage to the primary from saturation of the core. Resistor 21 is 10,000 ohms in value, it being desirable for a preferred circuit that the value of this resistance be at least about 1,000 ohms.

An operational amplifier 30 (National Semiconductor LF351) has its plus input connected to ground and to the first end 18 of secondary 12. Its negative input connects directly to the second end of secondary 12. To compensate for operational amplifier voltage offset error, a large value capacitor 23 (shown in dotted line configuration) may be placed in series with this connection. The output of operational amplifier 30 connects to its negative input through a 10,000 ohm resistor. The output of this circuit $E_{OUT}$ is obtained between terminal 28 which connects to the output of the operational amplifier and terminal 29 which connects to ground.

Calculation indicates that the gain of this amplifier stage can be represented by the following formula, assuming a 1:1 turns ratio for the transformer:

$$\frac{X_L A}{\frac{R_1}{R_2}\left[X_L\left(A + 1 + \frac{R_1}{R_2}\right)\right] + 1} = \text{GAIN}$$

where $X_L$ is the inductance of the transformer, A is the gain of the operational amplifier, $R_1$ is resistor 21 and $R_2$ is resistor 22. Since A is large with respect to 1, this equation approximates:

$$\frac{X_L A}{\frac{R_1}{R_2} X_L A + 1} = \text{GAIN}$$

It is important to observe that while the gain of an operational amplifier rolls off at about 6 dB per octave, the inductive reactance is increasing with frequency. Thus the result is an inherently extremely broad bandwidth for the configuration. The product of $X_L$ times A is approximately a constant over a wide range of frequencies. Thus the gain is approximately constant over the same range of frequencies.

Figure 2:
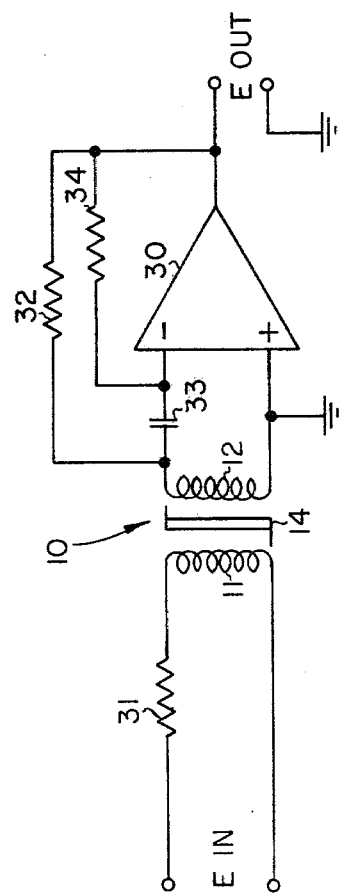
FIG. 2 discloses an alternate circuit of the isolation amplifier in a simple form.

Referring more particularly to FIG. 2 there is illustrated a variation of the circuit of FIG. 1. Since the circuit is for use only with A.C. input signals, only a 10,000 ohm input resistor 31 is placed between the input terminals and the primary winding 11. (Components with identical item members are of the same type as previously described.) To overcome the problem of an operational amplifier voltage offset, capacitor 33 is placed between the minus input of amplifier 30 and secondary winding 12. To provide the feedback necessary to effect an apparent low impedance input on the operational amplifier 30, a 10,000 ohm resistor 32 connects from the output to the secondary while a 1 megohm resistor 34 connects to the negative input of the operational amplifier 30.

Figure 3:
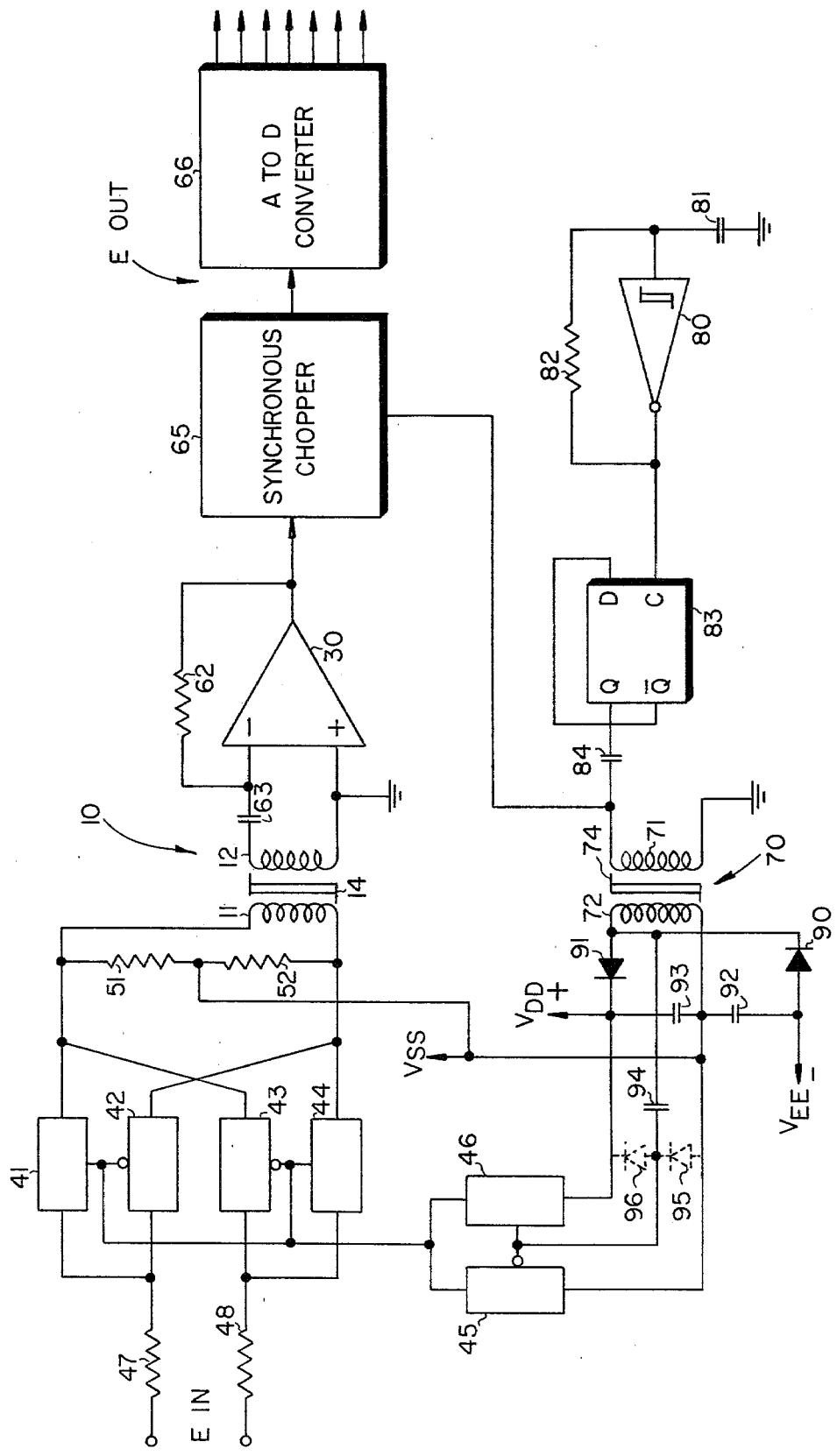
FIG. 3 discloses a third version of the isolation amplifier which incorporates synchronous choppers and which provides for quite linear analog response from D.C. to high frequencies in excess of 4 MHz.

Referring to FIG. 3, there is illustrated a further modification of the circuits of FIGS. 1 and 2. The input resistance is split into two equal 5,000 ohm resistors 47 and 48. These connect from the input terminals to two pairs of transmission gates 41 and 42, and 43 and 44, respectively. The outputs of gates 41 and 43 connect to one end of primary winding 11, while the outputs of gates 42 and 44 connect to the other end of primary winding 11. A capacitor 63 and resistor 62 serve the same function as the corresponding capacitor 23 and resistor 22 of FIG. 1. The output of operational amplifier 30 connects to a synchronous chopper 65. Chopper 65 periodically alternates the phase of the signal from the output of amplifier 30 in synchrony with the operation of gates 41-44 which also function in a similar manner. Chopper 65 also includes a low pass filter to remove chopper generated frequencies. The $E_{OUT}$ signal produced by chopper 65 is converted to a digital signal by A to D converter 66, in order to provide signals useful by digital computing equipment, such as an programmable industrial controller.

In the lower portion of FIG. 3 there is circuitry for generating a signal for driving the choppers and for providing an isolated power supply which couples to the primary side of transformer 10. A second transformer 70 has a primary winding 71, a secondary winding 72 and a core 74, all identical to the corresponding parts of transformer 10. The end of primary 71 of transformer 70 which is closest to secondary 72 is the winding which is grounded (as was end 18 of secondary 12 in the previously discussed transformer 10) However, since neither the primary nor the secondary has a low impedance termination, the transformer operates as a square loop pulse transformer, with its core saturating during each half cycle. Schmitt trigger inverting amplifier 80, with resistor 82 connecting from its output to its input and capacitor 81 connecting from its input to ground, function as an oscillator. A symmetrical square wave output signal is obtained by clocking flip-flop 83 with the output of amplifier 80. The Q output of flip-flop 83 connects to the primary 71 of transformer 70 and to the synchronous chopper 65 through capacitor 84.

The secondary 72 of transformer 70 provides a negative ($V_{EE}$) and positive ($V_{DD}$) supply by connection on one end to a common $V_{SS}$ line and through oppositely poled diodes 90 and 91 to capacitors 92 and 93 filtering with respect to the $V_{SS}$ line. The $V_{SS}$ line provides a reference to primary winding 11 and gates 41–44 through equal value resistors 51 and 52. This maximizes immunity from common mode interference. Gates 41 and 43 and gates 42 and 44 are alternately controlled at their control inputs for chopping the input signal. The drive signal for their control inputs come from two additional transmission gates 45 and 46. The control inputs of these two gates connect through a capacitor to secondary winding 72 at the point of connection to diodes 90 and 91. Diodes 95 and 96 shown in dotted line configuration are actually a part of the transmission gates design, and serve to convert the pulse from secondary 72 to a square wave for controlling transmission gates 45 and 46. Gates 41–46 receive power from the $V_{EE}$, $V_{DD}$, and $V_{SS}$ lines in conventional connections, not shown, for the RCA CD4053B part.

What is claimed is:
1. An isolation amplifier comprising:
(a) two input terminals;
(b) a ground terminal;
(c) a square loop transformer having a primary and a secondary winding positioned with one end of the primary winding adjacent one end of the secondary winding, and in which said transformer will saturate in less than 10 microseconds with a 10 volt signal applied to the primary;
(d) means for permanently connecting one of said one ends of said transformer windings to said ground terminal;
(e) a resistive coupling between said two input terminals and the primary of said transformer;
(f) an operational amplifier having its input coupled across the secondary winding of said transformer; and
(g) a resistor connecting from the output of said operational amplifier to the negative input.

2. The isolation amplifier of claim 1 in which said means for permanently connecting connects one end of said secondary winding to ground.

3. The isolation amplifier of claim 1 in which said transformer is a square loop transformer having a toroidal core.

4. The isolation amplifier of claim 3 in which said core has an outside diameter of about 3 mm. and an inside diameter of about 1.3 mm.

5. An isolation amplifier comprising:
   (a) two input terminals;
   (b) a transformer having a primary and a secondary winding and having a torroidal core made of a grain oriented alloy having a relative permeability of over 30,000 and which will saturate in less than 10 microseconds with a 10 volt signal applied to the primary;
   (c) a resistive coupling of at least 1,000 ohms between said two input terminals and the primary of said transformer, said resistive coupling being capable of handling 10 volt signals on the input terminals;
   (d) an operational amplifier having its input coupled across the secondary winding of said transformer; and
   (e) a resistor connecting from the output of said operational amplifier to the negative input.

6. The isolation amplifier of claim 5 in which said core has an outside diameter of about 3 mm. and an inside diameter of about 1.3 mm.

7. The isolation amplifier of claim 5 in which said transformer will saturate in about 2 microseconds with a 10 volt signal applied to the primary.

8. The isolation amplifier of claim 5 in which said core is made of a grain oriented nickel iron alloy.

9. An isolation amplifier comprising:
   (a) two input terminals;
   (b) a transformer having a primary and a secondary winding, each with first and second ends;
   (c) a resistive coupling of at least 1,000 ohms between said two input terminals and the first and second ends of said primary of said transformer;
   (d) a low impedance input amplifier having its input connected across the secondary winding of said transformer, said low impedance input amplifier having an effective input impedance sufficiently low that when added to the resistance of said secondary and reflected through to the primary its value is less than about one thousandth of the value of said resistive coupling; and
   (e) a first chopper means connected to the primary of said transformer for periodically alternating the phase of the input signal applied through said resistive coupling to the two ends of said primary 180°.

10. The isolation amplifier of claim 9 which additionally includes a second chopper means connected to the output of said low impedance input amplifier and synchronized to said first chopper means.

11. The isolation amplifier of claim 9 in which said first chopper means includes four transmission gates, the first and third of which have their outputs connected to the first end of said primary winding of said transformer and the second and fourth of which have their outputs connected to the second end of said primary winding of said transformer.

12. The isolation amplifier of claim 11 which additionally includes an isolated power supply coupled to the primary side of said transformer and including:
   (a) a second transformer having a primary and a secondary winding;
   (b) an oscillator means connecting to said primary winding;
   (c) first and second capacitors, one end of each of said capacitors connecting to one end of said secondary of said second transformer and the other ends of said capacitors connecting through oppositely poled diodes, respectively, to the other end of said secondary of said second transformer;
   (d) gate control means for alternately controlling said first and third and said second and fourth gates, respectively; and
   (e) a third capacitor connecting between said other end of said secondary of said second transformer to said gate control means.

* * * * *